United States Patent
Andelic

(10) Patent No.: US 10,627,472 B2
(45) Date of Patent: Apr. 21, 2020

(54) METHOD FOR OPERATING AN INDUCTIVE CONDUCTIVITY SENSOR AND RESPECTIVE INDUCTIVE CONDUCTIVITY SENSOR

(71) Applicant: KROHNE Messtechnik GmbH, Duisburg (DE)

(72) Inventor: Edin Andelic, Hagen (DE)

(73) Assignee: KROHNE MESSTECHNIK GMBH, Duisburg (DE)

( * ) Notice: Subject to any disclaimer, the term of this patent is extended or adjusted under 35 U.S.C. 154(b) by 50 days.

(21) Appl. No.: 15/455,318

(22) Filed: Mar. 10, 2017

(65) Prior Publication Data
US 2017/0261588 A1  Sep. 14, 2017

(30) Foreign Application Priority Data
Mar. 11, 2016  (DE) .......................... 10 2016 104 549

(51) Int. Cl.
  *G01R 35/00*  (2006.01)
  *G01N 27/02*  (2006.01)

(52) U.S. Cl.
  CPC .......... *G01R 35/007* (2013.01); *G01N 27/025* (2013.01)

(58) Field of Classification Search
  CPC ............................ G01R 35/007; G01N 27/025
  See application file for complete search history.

(56) References Cited

U.S. PATENT DOCUMENTS

| | | | |
|---|---|---|---|
| 8,581,575 B2 | 11/2013 | Eberheim et al. | |
| 9,310,327 B2 | 4/2016 | Roper et al. | |
| 9,589,686 B2 | 3/2017 | Potyrailo et al. | |
| 2005/0127908 A1* | 6/2005 | Schlicker | G01N 27/023 324/240 |
| 2006/0170410 A1* | 8/2006 | Bjorn | G01R 15/246 324/96 |
| 2012/0161787 A1* | 6/2012 | Potyrailo | G01N 27/02 324/652 |
| 2016/0047768 A1* | 2/2016 | Dabelstein | G01N 27/025 324/239 |
| 2016/0187275 A1* | 6/2016 | Pickles | G01D 5/2405 324/655 |

* cited by examiner

*Primary Examiner* — Akm Zakaria
(74) *Attorney, Agent, or Firm* — David S. Safran; Roberts Calderon Safran & Cole, P.C.

(57) ABSTRACT

A method for operating an inductive conductivity sensor, wherein a first electric transmitter signal having a first signal frequency is generated and supplied to the transmitter coil, a first electric receiver signal is measured at the receiver coil and a first conductivity of the medium determined from the first electric receiver and first electric transmitter signals using a first calibration model. At least one further electric transmitter signal having a different signal frequency is generated and supplied to the transmitter coil, a further electric receiver signal is measured at the receiver coil and a further conductivity of the medium determined from the further electric receiver and electric transmitter signals using another calibration model, at least one conductivity difference is determined between each of the determined conductivities of the medium and when the at least one conductivity difference exceeds a threshold conductivity difference, the conductivity difference is signaled as an error.

10 Claims, 2 Drawing Sheets

METHOD FOR OPERATING AN INDUCTIVE CONDUCTIVITY SENSOR AND RESPECTIVE INDUCTIVE CONDUCTIVITY SENSOR

BACKGROUND OF THE INVENTION

Field of the Invention

The invention relates to a method for operating an inductive conductivity sensor. For carrying out the method, the conductivity sensor has a transmitter coil and a receiver coil and the transmitter coil and the receiver coil are inductively coupled to one another by an electrically conductive medium. In the method, a first electric transmitter signal is generated having a first signal frequency and is supplied to the transmitter coil and a first electric receiver signal is measured at the transmitter coil. Using a first calibration method for the first signal frequency, a first conductivity of the medium is determined from the first electric receiver signal and the first electric transmitter signal.

Description of Related Art

The invention also relates to an inductive conductivity sensor. The conductivity sensor has a transmitter coil, a receiver coil, a signal generator, a measuring unit and a control unit. The signal generator is designed for generating electric transmitter signals and for guiding the transmitter signals to the transmitter coil and the measuring unit is designed for measuring electric receiver signals at the receiver coil. During operation of the conductivity sensor, the transmitter coil and the receiver coil are inductively coupled to one another by an electrically conductive medium. The control unit is designed in such a manner and controls the signal generator and the measuring unit during operation in such a manner that the signal generator generates a first electric transmitter signal with a first signal frequency and the measuring unit measures a first electric receiver signal at the receiver coil. The control unit determines a first conductivity of the medium from the first electric receiver signal and the first electric transmitter signal by using a first calibration model for the first signal frequency stored in the control unit.

Inductive conductivity sensors can also be used in aggressive and corrosive media such as, for example, industrial waste water, sea water and acidic solutions, because both the transmitter coil and the receiver coil do not have to come into immediate contact with a medium, rather can be surrounded by an aggressive and corrosive media resistant housing, without limiting the functionality of an inductive conductivity sensor. Since there is no immediate contact to aggressive and corrosive media, conductivity sensors are characterized by a long service life and by being practically maintenance-free. Due to the housing, they are also further suitable for hygienic applications in processes of the food, drink and pharmaceutical industries.

The conductivity of an electrically conductive medium is determined by an inductive conductivity sensor in that an electric transmitter signal is generated having a signal frequency and is supplied to the transmitter coil. The electric transmitter signal is transmitted to the medium by the transmitter coil and the medium conveys the transmitter signal to the receiver coil. In the receiver coil, the transmitter signal conveyed by the medium induces a receiver signal, which is measured. The magnitude of the receiver signal in respect to the magnitude of the transmitter signal is a measure for the electric conductivity of the medium. A calibration model accordingly determines the conductivity of the medium from the electric receiver signal and the electric transmitter signal. A calibration model describes the correlation between, on the one hand, the electric conductivity of a medium and, on the other hand, the electric receiver signal and the electric transmitter signal for a frequency. A calibration model, which is valid for a signal frequency other than the signal frequency used for determining the conductivity of the medium, provides conductivities that differ from the actual conductivity of the medium.

It is known in practice that inductive conductivity sensors can have defects that are not recognized during operation and are first recognized during a special screening.

SUMMARY OF THE INVENTION

Thus, the object of the invention is to provide a method for operating an inductive conductivity sensor as well to provide an electric conductivity sensor, in which errors are recognized and signalized during operation.

According to a first teaching, the invention relates to a method for operating an inductive conductivity sensor, in which the above derived and described object is achieved. The method according to the invention is initially and essentially characterized by the following method steps, which follow the method steps for determining the conductivity of the medium known from the prior art:

In a first method step, at least one further electric transmitter signal having a further signal frequency differing from the first signal frequency is generated and supplied to the transmitter coil, a further receiver signal is measured at the receiver coil and a further conductivity of the medium is determined from the further electric receiver signal and the further electric transmitter signal using a calibration method for the further signal frequency. Each of the further electric transmitter signals thereby has a signal frequency differing from the other transmitter signals and requires the use of a further calibration model for this exact further signal frequency. If the further calibration model is used for a frequency other than this further signal frequency, then the conductivity of the medium determined with the calibration model deviates from the actual conductivity of the medium.

In a second method step, at least one conductivity difference is determined between each of the two determined conductivities of the medium. The conductivity difference can be carried out, e.g., by subtraction of one of the determined conductivities from another of the determined conductivities. It is recommendable to subtract two temporally consecutive determined conductivities from one another. Each of the conductivity differences is characterized by an absolute value and an algebraic sign.

In a third method step, the conductivity difference is signalized as an error, when the at least one conductivity different exceeds a conductivity difference threshold. The conductivity difference threshold is a predeterminable, still tolerable conductivity difference between two each of the determined conductivities of the medium, the conductivity difference being dependent on the respective application of an inductive conductivity sensor. Additionally or alternatively to signalizing an error, the inductive conductivity sensor is deactivated when the conductivity difference threshold is exceeded, so that no further determinations of the conductivity of the medium are carried out.

The method according to the invention has the advantage over the prior art that errors of the inductive conductivity sensor are recognized and indicated during operation.

The calibration models describe the relation between, on the one hand, the electric conductivity of the medium and, on the other hand, the relation between the measured receiver signals and the generated transmitter signals, wherein, for each of the signal frequencies, one calibration model is used for this specific signal frequency. In a first implementation of the method according to the invention, it is provided that each of the calibration models determines the respective conductivity as a function of a quotient of the electric receiver signal and the electric transmitter signal. Thereby, the respective function has a linear interpolation or a polynomial.

The generation of a first electric transmitter signal and the generation of at least one further electric transmitter signal can take place at differing times. In one implementation of the method according to the invention, it is provided that the first electric transmitter signal and at least the at least one further electric transmitter signal are simultaneously generated. The simultaneous generation of the transmitter signal makes a time-efficient method possible. The simultaneous generation of the transmitter signals also causes a simultaneous measurement of the first receiver signal and at least the at least one further receiver signal. Because of the differing signal frequencies of the individual transmitter signals, the individual receiver signals can also be differentiated, so that the individual conductivities of the medium can be determined.

In an alternative implementation to the above implementations, it is provided that the first electric transmitter signal and at least the at least one further electric transmitter signal are generated temporally directly consecutively. The direct consecutive generation of the transmitter signal causes the first electric receiver signal and at least the at least one further electric receiver signal to be measured temporally directly consecutively at the receiver coil. The temporally directly consecutive generation of the transmitter signal and the temporally directly consecutive measurement of the receiver signal brings about a resource-efficient implementation of the method, since the receiver signals do not have to be separated according to their signal frequencies, rather can be evaluated directly one after the other.

In a further implementation of the method, it is provided that at least two further electric transmitter signals are generated, wherein the signal frequencies of at least the first electric signal and the at least two further electric signals differ from one another and that at least two conductivity differences between two each of the determined conductivities of the medium are determined. Each of the generated electric transmitter signals has a signal frequency that differs from the signal frequencies of the other generated electric transmitter signals and is supplied to the transmitter coil. Also, each of the electric receiver signals generated by one of the transmitter signals is measured at the receiver coil and the conductivity of the medium is determined from the respective electric receiver signal and the respective electric transmitter signal using the calibration model for this signal frequency. Furthermore, a conductivity difference between two each of the determined conductivities of the medium is determined and, when at least one of the conductivity differences exceeds the conductivity difference threshold, this conductivity difference is signalized as an error.

Consequently, at least two conductivity differences are determined when at least two further electric transmitter signals are generated in addition to the first electric transmitter signal, wherein each of the conductivity differences has an absolute value and an algebraic sign. Surprisingly, it has been seen that certain errors can be indicated by the algebraic sign of the determined conductivity differences. Thus, it is provided in a further development of the above implementation that the algebraic signs of the at least two conductivity differences are evaluated and that non-uniform algebraic signs signalize an error in the mechanics of the conductivity sensor. In a further development additional or alternative to the above further development, it is provided that the algebraic signs of the at least two conductivity differences are evaluated and the uniform algebraic sign is signalized as an error in the calibration model.

In a further development of the method according to the invention, it is further provided that the method is multiply carried out and the frequentness of the signalized error is signalized. By multiply carrying out the method and signalizing the frequentness of the error, erroneously signalized errors are recognized and are compensated in one implementation by voting, thereby improving the reliability of the method.

According to a second teaching, the invention relates to an inductive conductivity sensor, in which the above derived and described object is achieved. The inductive conductivity sensor according to the invention is initially and essentially wherein the control unit is additionally designed in such a manner and, during operation, controls the signal generator and the measuring unit in such a manner, that the signal generator generates at least one further electric transmitter signal having a further signal frequency differing from the first signal frequency, that the measuring unit measures a further electric receiver signal at the receiver coil and the control unit determines a further conductivity of the medium from the further electric receiver signal and the further electric transmitter signal by using a further calibration model for the further signal frequency stored in the control unit. Furthermore, the control unit determines at least one conductivity difference between two each of the determined conductivities of the medium and, when the at least one conductivity difference exceeds a threshold conductivity difference stored in the control unit, the control unit signalizes the conductivity difference as an error.

One design of the inductive conductivity sensor according to the invention provides that the control unit is designed for carrying out one of the described methods.

The explanations for the method accordingly also apply to the inductive conductivity sensor and vice versa.

In detail, a plurality of possibilities are given for designing and further developing the method according to the invention and the conductivity sensor according to the invention as will be apparent from the following description of a preferred embodiment in conjunction with the accompanying drawings.

DETAILED DESCRIPTION OF THE INVENTION

Figure 1:
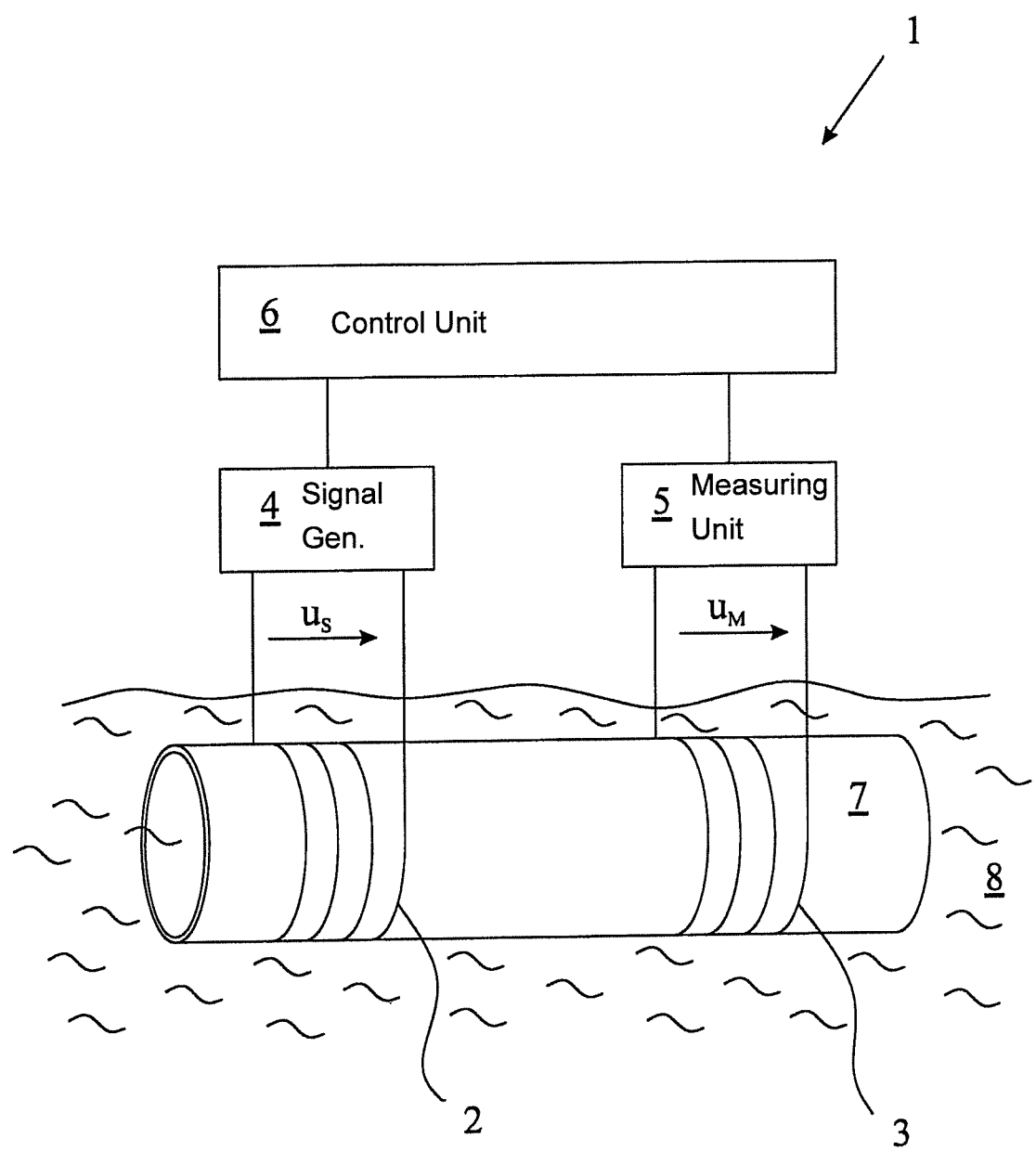
FIG. 1 is a schematic perspective view of an embodiment of an inductive conductivity sensor according to the invention and FIG. 2 is a flowchart of an embodiment of the method in accordance with the invention.

FIG. 1 shows an inductive conductivity sensor 1 that has a transmitter coil 2, a receiver coil 3, a signal generator 4, a measuring unit 5 and a control unit 6. The transmitter coil 2 and the receiver coil 3 are arranged on the hollow cylinder shaped carrier 7. In operation, the inductive conductivity sensor 1 with the carrier 7 with the transmitter coil 2 and the receiver coil 3 are immersed in the medium 8.

The medium 8 surrounds and is within the carrier 7. The medium 8 is electrically conductive, and thus, inductively couples the transmitter coil 2 and the receiver coil 3 to one another. What is not shown in the figure is the housing, which prevents direct contact between the conductivity sensor 1 and the medium 8.

The signal generator 4 is designed for generating electric transmitter signals $u_S$ and supplying the transmitter signals $u_S$ to the transmitter coil 2 and the measuring unit 5 is designed for measuring electric receiver signals $u_M$ at the receiver coil 3. Both the electric transmitter signals $u_S$ and the electric receiver signals $u_M$ are electric alternating voltages. The conductivity of the electrically conductive medium 8 is determined by the inductive conductivity sensor 1, in that first an electric transmitter signal $u_S$ having a signal frequency is generated and supplied to the transmitter coil. The electric transmitter signal is transmitted to the medium 8 by the transmitter coil 2 and the medium 8 conveys the transmitter signal to the receiver coil 3.

In the receiver coil 3, the transmitter signal conveyed by the medium 8 induces a receiver signal $u_S$, which is measured by the measuring unit 5. The magnitude of the receiver signal $u_M$ in respect to the magnitude of the transmitter signal $u_S$ is a measure for the electric conductivity of the medium 8. A calibration model stored in the control unit 6 accordingly determines the conductivity of the medium 8 from the electric receiver signal $u_M$ and the electric transmitter signal $u_S$. The calibration model describes the relation between, on the one hand, the electric conductivity of the medium 8, and on the other hand, the electric receiver signal $u_M$ and the electric transmitter signal $u_S$ for the frequency of the transmitter signal $u_S$. A calibration model valid for a signal frequency other than the signal frequency used for determining the conductivity of the medium 8 provides conductivities that differ from the actual conductivity of the medium 8.

Figure 2:
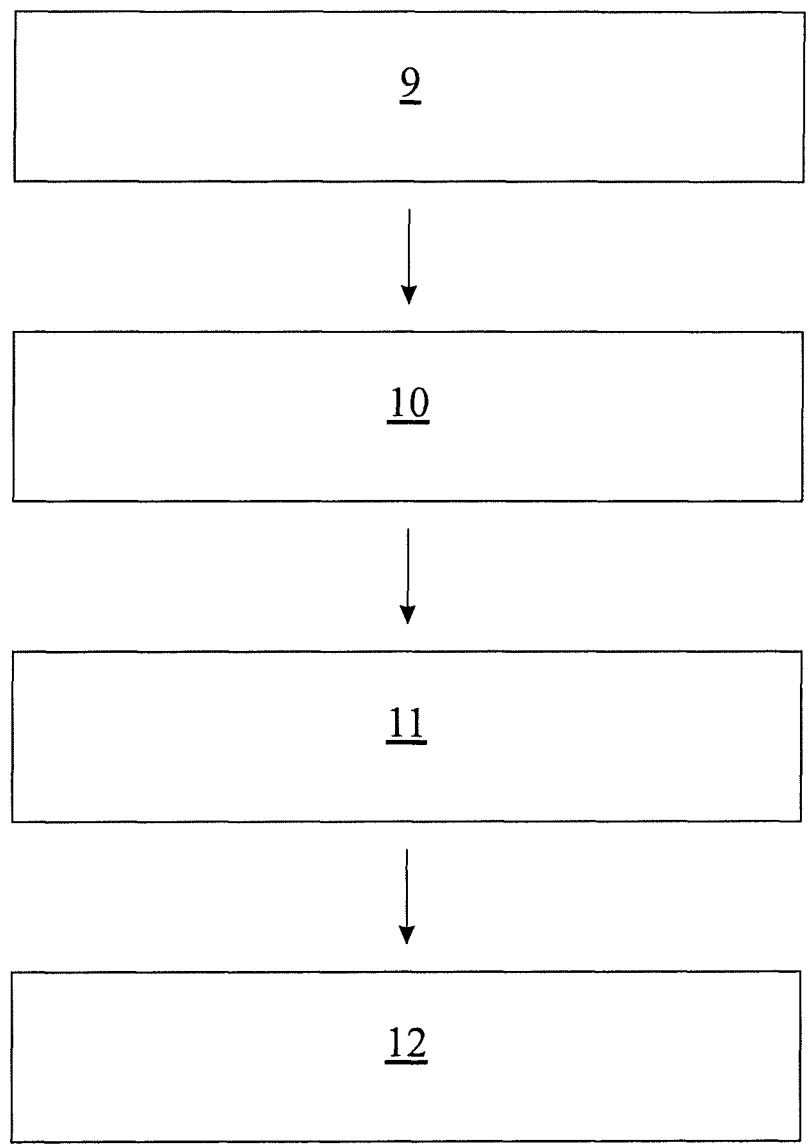

When the inductive conductivity sensor 1 is in operation, the conductivity sensor 1 carries out the method shown in the flowchart in FIG. 2 with the following method steps.

In the first method step 9, the control unit 6 controls the signal generator 4 and the measuring unit 5 in such a manner that the signal generator 4 generates a first electric transmitter signal $u_{S,1}$ having a first signal frequency, the measuring unit 5 measures a first electric receiver signal $u_{M,1}$ at the receiver coil 3 and the control unit 6 determines a first conductivity of the medium from the first electric receiver signal $u_{M,1}$ and the first electric transmitter signal $u_{S,1}$ using a first calibration model stored in the control unit 6 for the first signal frequency.

In the second method step 10, the control unit 6 controls the signal generator 4 and the measuring unit 5 in such a manner that the signal generator 4 generates a second electric transmitter signal $u_{S,2}$ having a second signal frequency that is different from the first signal frequency, temporally directly following the first electric transmitter signal $u_{S,1}$, and generates a third electric transmitter signal $u_{S,3}$ having a third signal frequency differing from the first signal frequency and the second signal frequency temporally directly following the second electric transmitter signal $u_{S,2}$. The measuring unit 5 measures a second electric receiver signal $u_{M,2}$ caused by the second electric transmitter signal $u_{S,2}$ and a third electric receiver signal $u_{M,3}$ caused by the third electric transmitter signal $u_{S,3}$. The control unit 6 determines a second conductivity of the medium from the second electric receiver signal $u_{M,2}$ and the second electric transmitter signal $u_{S,2}$ by using a second calibration model for the second signal frequency stored in the control unit 6 and determines a third conductivity of the medium from the third electric receiver signal $u_{M,3}$ and the third electric transmitter signal $u_{S,3}$ by using a third calibration model for the second signal frequency stored in the control unit 6.

Each of the three calibration models describes the correlation between, on the one hand, the electric conductivity of the medium 8, and on the other hand, the respective electric receiver signal $u_M$ and the respective electric transmitter signal $u_S$ for each one of the three frequencies. A calibration model that has been determined for a signal frequency other than signal frequency used for determining the conductivity of the medium provides conductivities deviating from the actual conductivity of the medium 8.

It holds true for each of the three calibration models that each conductivity is determined as a function of a quotient of the electric receiver signal $u_M$ and the electric transmitter signal $u_S$. Thereby, the respective function has a polynomial. Thus, the polynomial is a function of the quotient.

In the third method step 11, the control unit 6 determines a first conductivity difference between the third conductivity and the second conductivity and a second conductivity difference between the second conductivity and the first conductivity of the medium 8. The conductivity differences are thus each determined between two temporally consecutively determined conductivities of the medium 8.

In the fourth method step 12, the control unit 6 signalizes, when at least one of the two conductivity differences exceeds a conductivity difference threshold stored in the control unit 6, this conductivity difference indicates the existence of an error. The conductivity difference threshold is a predeterminable, still tolerable conductivity difference between each two of the determined conductivities of the medium 8, the conductivity difference being dependent on the respective application of an inductive conductivity sensor 1.

What is claimed is:

1. A method for operating an inductive conductivity sensor, comprising:

a transmitter coil and a receiver coil, the transmitter coil and the receiver coil being inductively coupled to one another by an electrically conductive medium, generating a first electric transmitter signal having a first signal frequency and supplying the first electric transmitter signal to the transmitter coil, measuring a first electric receiver signal at the receiver coil and determining a first conductivity of the medium using a first calibration model for the first signal frequency that correlates between the electric conductivity of the medium and the measured first electric receiver signal and the generated first electric transmitter signal, generating at least one further electric transmitter signal having a further signal frequency differing from the first signal frequency and supplying the at least one further electric transmitter signal to the transmitter coil, measuring a further electric receiver signal at the receiver coil and determining a further conductivity of the medium from the further electric receiver signal and the at least one further electric transmitter signal using a further calibration model which correlates between the further electric conductivity of the medium and the measured further electric receiver signal and the generated further electric transmitter signal, wherein the first calibration model is operable only with the first signal frequency and the further calibration model is operable only with the further signal frequency, determining at least one conductivity difference between the two determined conductivities of the medium, and when the at least one conductivity difference exceeds a threshold conductivity difference, a signal is issued indicating a sensor error has occurred.

2. The method according to claim 1, wherein that each of the calibration models determines a respective conductivity as a function of a quotient of the electric receiver signal and the electric transmitter signal, wherein the respective function has a linear interpolation or a polynomial.

3. The method according to claim 1, wherein the first electric transmitter signal and the at least one further electric transmitter signal are simultaneously generated.

4. The method according to claim 1, wherein the first electric transmitter signal and at least the at least one further electric transmitter signal are generated temporally directly consecutively.

5. The method according to claim 1, wherein at least two further electric transmitter signals are generated, wherein the signal frequencies of at least the first electric signal and the at least two further electric transmitter signals differ from one another, and wherein at least two conductivity differences are determined between each two of the determined conductivities of the medium.

6. The method according to claim 5, wherein an algebraic sign of the at least two conductivity differences is evaluated and wherein uniform algebraic signs indicate an error in the calibration models.

7. The method according to claim 6, wherein the algebraic signs of the at least two conductivity differences are evaluated and wherein non-uniform algebraic signs are signalized as an error in the mechanics of the conductivity sensor.

8. The method according to claim 1, wherein the method is carried out multiple times and a frequentness of the signalized error is indicated.

9. An inductive conductivity sensor, comprising:
a transmitter coil,
a receiver coil,
a signal generator,
a measuring unit, and
a control unit,
wherein the signal generator is constructed for generating electric transmitter signals and supplying the transmitter signals to the transmitter coil
wherein the measuring unit is adapted for measuring electric receiver signals at the receiver coil,
wherein, during operation of the conductivity sensor, the transmitter coil and the receiver coil are adapted to be inductively coupled to one another by an electrically conductive medium, wherein the control unit is adapted for controlling the signal generator and the measuring unit in such a manner that the signal generator generates a first electric transmitter signal having a first signal frequency, the measuring unit measures a first electric receiver signal at the receiver coil and for determining a first conductivity of the medium from the first electric receiver signal and the first electric transmitter signal using a first calibration model for the first signal frequency stored in the control unit, the first calibration model correlating between the electric conductivity of the medium and the measured first electric receiver signal and the generated first electric transmitter signal, wherein the control unit is additionally adapted for controlling the signal generator and the measuring unit in such a manner that the signal generator generates at least one further electric transmitter signal having a further signal frequency differing from the first signal frequency, for measuring a further electric receiver signal at the receiver coil and for determining a further conductivity of the medium from the further electric receiver signal and the further electric transmitter signal using a further calibration model for the further signal frequency stored in the control unit, the further calibration model correlating between the further electric conductivity of the medium and the measured further electric receiver signal and the generated further electric transmitter signal, wherein the first calibration model is operable only with the first signal frequency and the further calibration model is operable only with the further signal frequency, wherein the control unit is adapted for determining at least one conductivity difference between each two of the first and further determined conductivities of the medium, and wherein the control unit is adapted for signaling the occurrence of an error when the at least one conductivity difference exceeds a threshold conductivity difference stored in the control unit.

10. The inductive conductivity sensor according to claim 9, wherein the control unit is adapted for evaluating an algebraic sign of at least two conductivity differences and for indicating an error in the calibration models when the algebraic signs are uniform.

* * * * *